US011302715B2

(12) United States Patent
Liu et al.

(10) Patent No.: US 11,302,715 B2
(45) Date of Patent: Apr. 12, 2022

(54) THREE-DIMENSIONAL MEMORY DEVICES AND FABRICATION METHODS THEREOF

(71) Applicant: YANGTZE MEMORY TECHNOLOGIES CO., LTD., Wuhan (CN)

(72) Inventors: Jun Liu, Wuhan (CN); Li Hong Xiao, Wuhan (CN); Yu Ting Zhou, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 17/100,851

(22) Filed: Nov. 21, 2020

(65) Prior Publication Data

US 2021/0104541 A1    Apr. 8, 2021

Related U.S. Application Data

(60) Division of application No. 16/231,479, filed on Dec. 22, 2018, now Pat. No. 10,892,276, which is a
(Continued)

(51) Int. Cl.
*H01L 27/11582* (2017.01)
*H01L 27/11568* (2017.01)
(Continued)

(52) U.S. Cl.
CPC .. *H01L 27/11582* (2013.01); *H01L 27/11568* (2013.01); *H01L 21/31105* (2013.01); *H01L 29/40117* (2019.08)

(58) Field of Classification Search
None
See application file for complete search history.

(56) References Cited

U.S. PATENT DOCUMENTS 9,728,551 B1 * 8/2017 Lu ..................... H01L 21/02164
10,256,252 B1 * 4/2019 Kanazawa ........ H01L 21/02164
(Continued)

FOREIGN PATENT DOCUMENTS

CN      105679761 A    6/2016
CN      106024798 A   10/2016
(Continued)

OTHER PUBLICATIONS

International Search Report issued in corresponding International Application No. PCT/CN2018/116935, dated Aug. 21, 2019, 5 pages.
(Continued)

*Primary Examiner* — Steven M Christopher
(74) *Attorney, Agent, or Firm* — Bayes PLLC

(57) ABSTRACT

Embodiments of three-dimensional (3D) memory devices having a memory layer that confines electron transportation and methods for forming the same are disclosed. The 3D memory device can include a structure of a plurality of gate electrodes insulated by a sealing structure over a substrate. The sealing structure can include an airgap between adjacent gate electrodes along a direction perpendicular to a top surface of the substrate. The 3D memory device can also include a semiconductor channel extending from a top surface of the structure to the substrate. The semiconductor channel can include a memory layer that has two portions extending along different directions. The 3D memory device can further include a source structure extending from the top surface of the structure to the substrate and between adjacent gate electrodes along a direction parallel to the top surface the substrate.

20 Claims, 12 Drawing Sheets

Related U.S. Application Data continuation of application No. PCT/CN2018/116935, filed on Nov. 22, 2018.

(51) Int. Cl.
  *H01L 21/28* (2006.01)
  *H01L 21/311* (2006.01)

(56) References Cited

U.S. PATENT DOCUMENTS

| | | | |
|---|---|---|---|
| 2012/0012920 A1* | 1/2012 | Shin | H01L 29/4234 257/324 |
| 2015/0008505 A1* | 1/2015 | Chien | H01L 29/7889 257/324 |
| 2015/0076580 A1 | 3/2015 | Pachamuthu | |
| 2015/0076584 A1 | 3/2015 | Pachamuthu et al. | |
| 2016/0086972 A1 | 3/2016 | Zhang et al. | |
| 2016/0172370 A1* | 6/2016 | Makala | H01L 27/11524 257/314 |
| 2016/0293625 A1* | 10/2016 | Kang | H01L 27/11573 |
| 2016/0300850 A1 | 10/2016 | Tang et al. | |
| 2017/0025431 A1* | 1/2017 | Kanakamedala | H01L 29/4234 |
| 2017/0243879 A1* | 8/2017 | Yu | H01L 27/1157 |
| 2017/0373080 A1 | 12/2017 | Akutsu et al. | |
| 2018/0083021 A1* | 3/2018 | Sakamoto | H01L 23/5283 |
| 2019/0287998 A1* | 9/2019 | Harada | H01L 29/40117 |

FOREIGN PATENT DOCUMENTS

| | | |
|---|---|---|
| CN | 108511454 A | 9/2018 |
| CN | 108538847 A | 9/2018 |
| CN | 108831889 A | 11/2018 |

OTHER PUBLICATIONS

Written Opinion of the International Searching Authority issued in corresponding International Application No. PCT/CN2018/116935, dated Aug. 21, 2019, 5 pages.

* cited by examiner

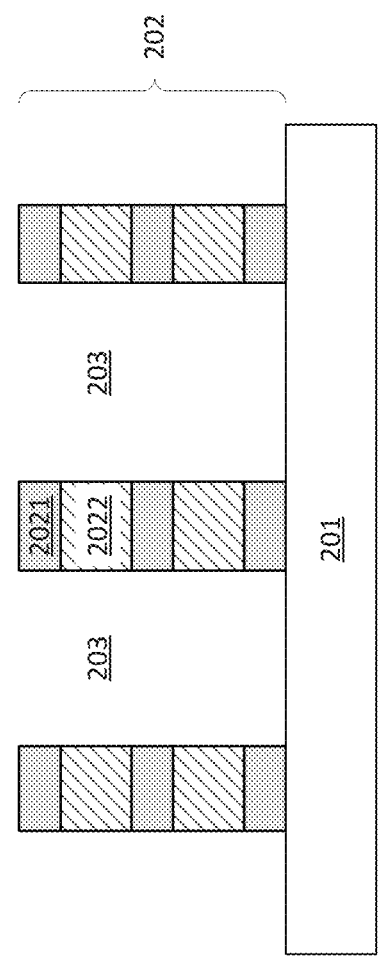
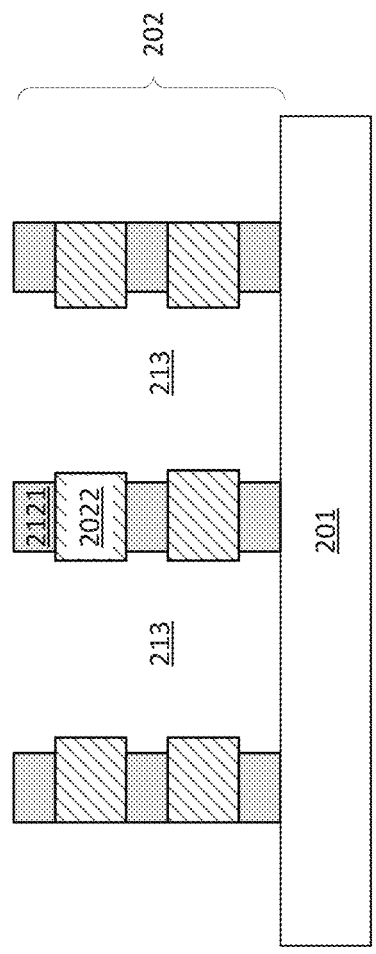
FIG. 2A
FIG. 2B

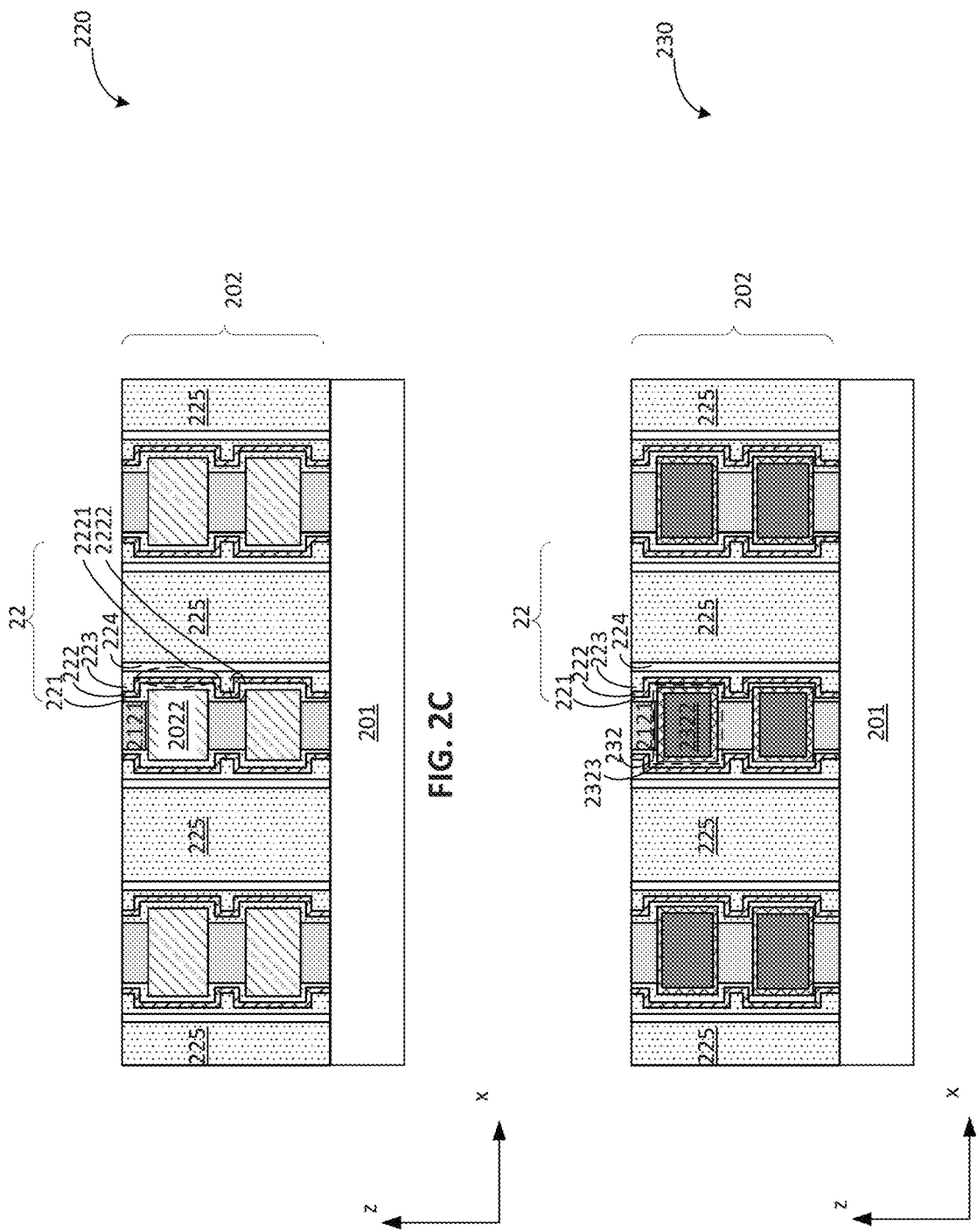

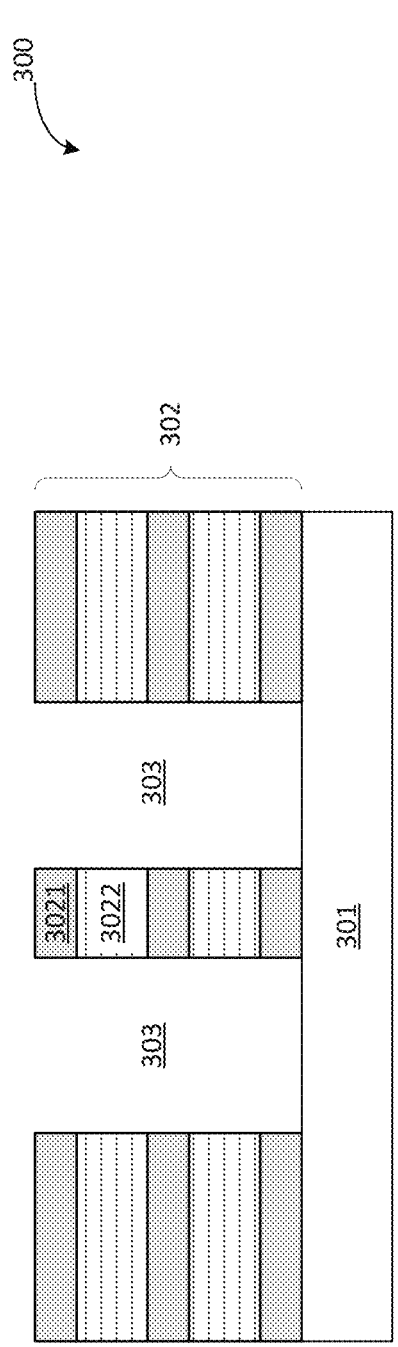
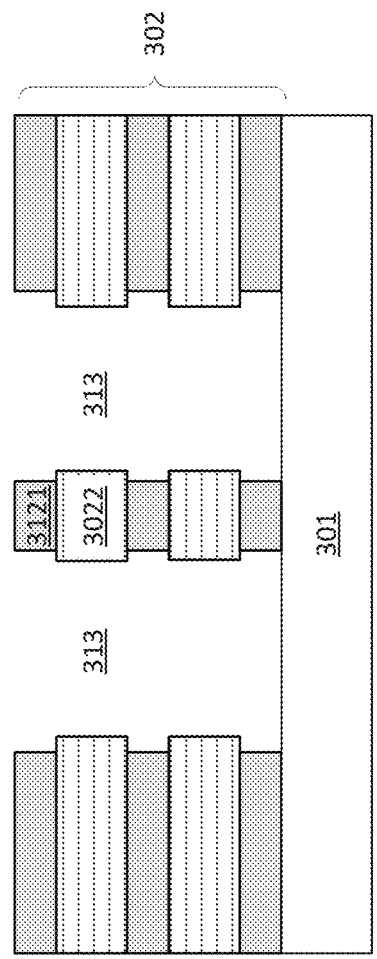
FIG. 3A
FIG. 3B

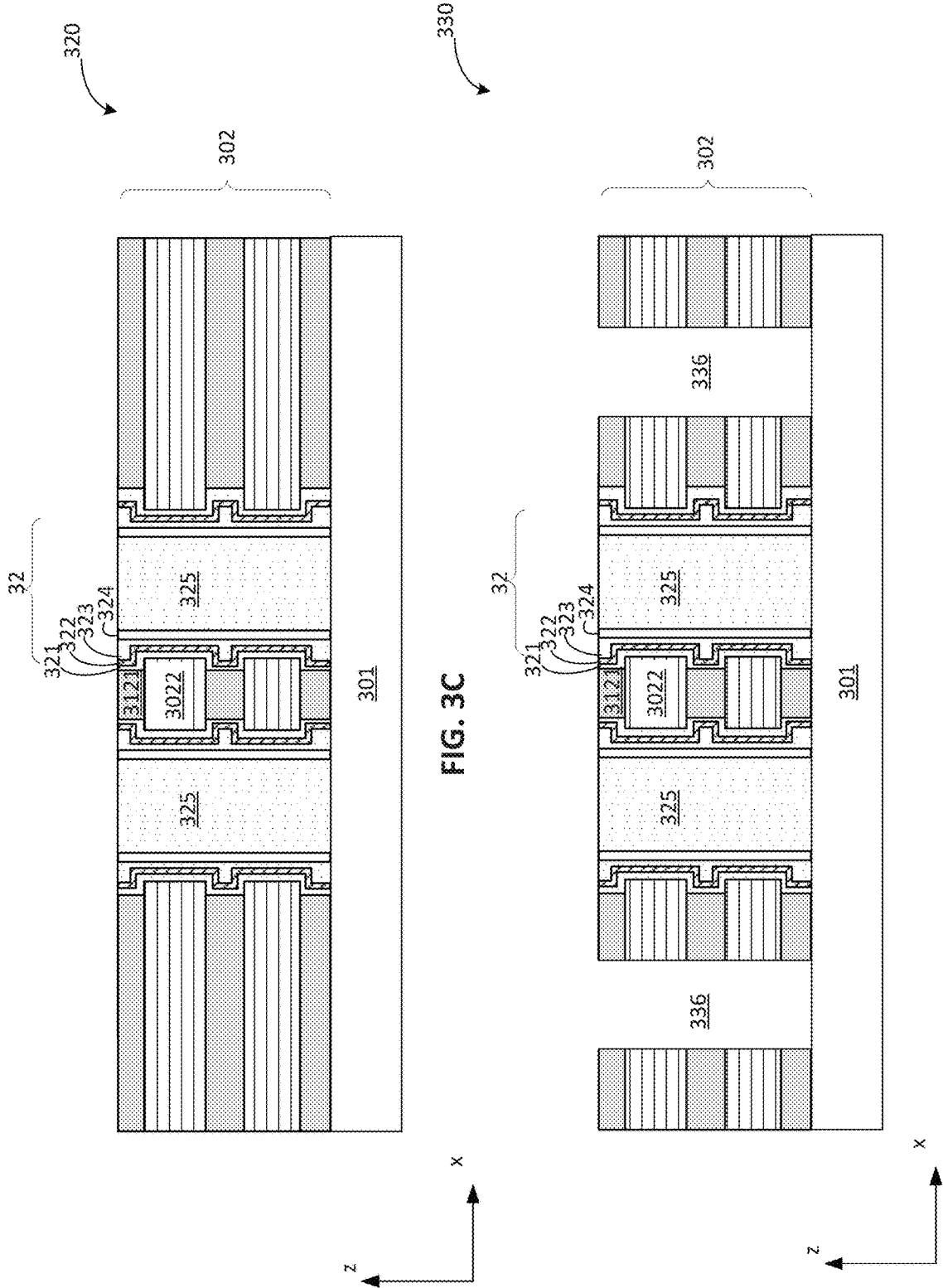

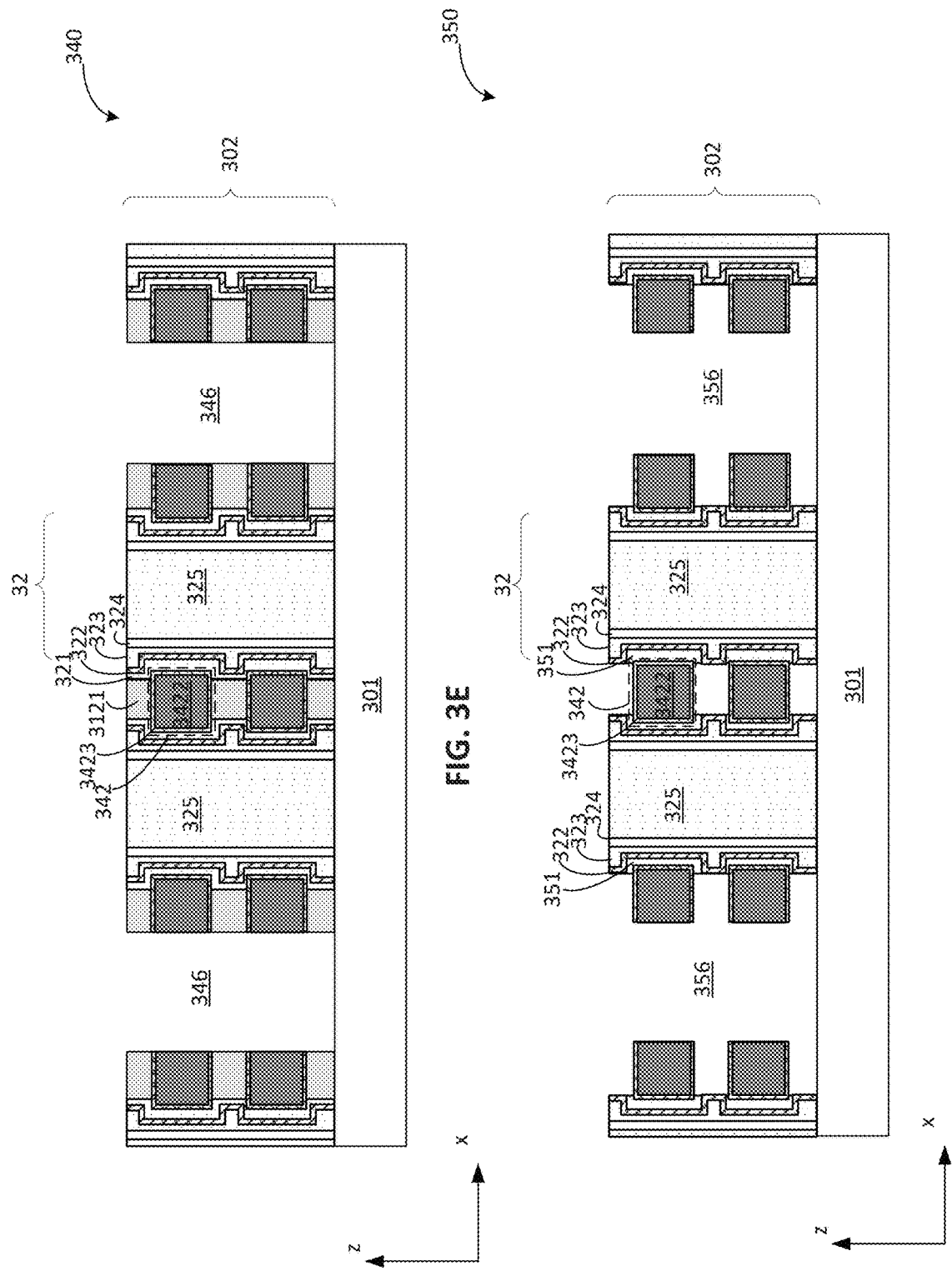

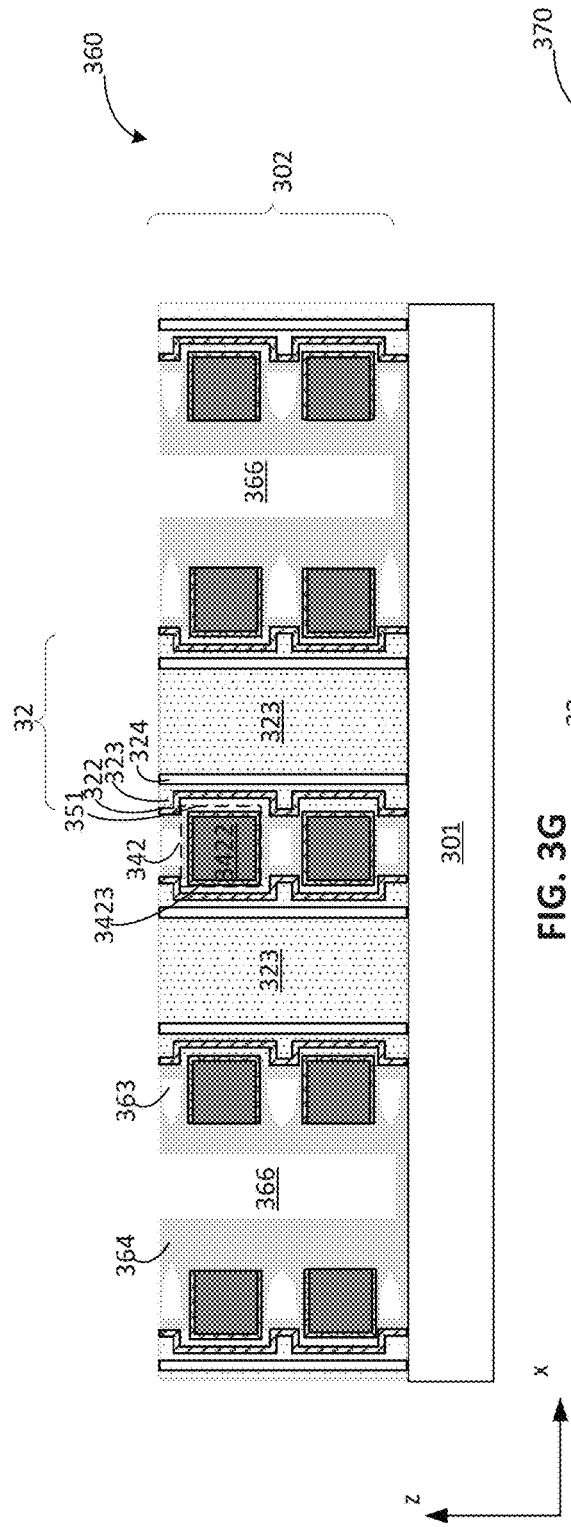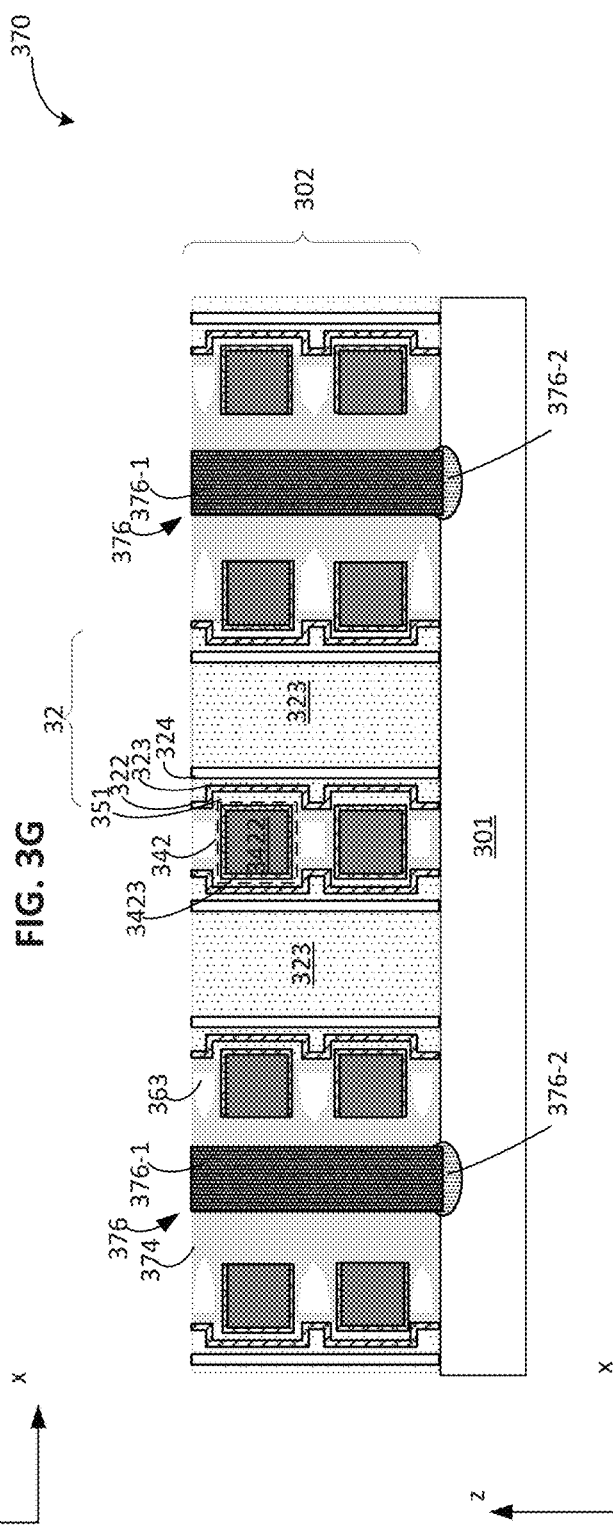

THREE-DIMENSIONAL MEMORY DEVICES AND FABRICATION METHODS THEREOF

CROSS REFERENCE TO RELATED APPLICATIONS

This application is division of U.S. application Ser. No. 16/231,479, filed on Dec. 22, 2018, entitled "THREE-DIMENSIONAL MEMORY DEVICES AND FABRICATION METHODS THEREOF," which is continuation of International Application No. PCT/CN2018/116935, filed on Nov. 22, 2018, entitled "THREE-DIMENSIONAL MEMORY DEVICES AND FABRICATION METHODS THEREOF," both of which are hereby incorporated by reference in their entireties.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory devices and the fabrication methods to fabricate the 3D memory devices are disclosed herein.

In one example, a method for forming a 3D memory device is disclosed. The method can include the following operations. First, an initial channel hole can be formed in a structure. The structure can include any suitable structure for forming memory cells within. For example, the structure can include a staircase structure and/or a stack structure of a plurality of layers. In an embodiment, the structure can include a plurality first layers and a plurality of second layers alternatingly arranged over a substrate. An offset can be formed between a side surface of each one of the plurality of first layers and a side surface of each one of the plurality of second layers on a sidewall of the initial channel hole to form a channel hole. A semiconductor channel can then be formed based on the channel hole. Further, a plurality of gate electrodes can be formed based on the plurality of second layers.

In another example, a method for forming a 3D memory device is disclosed. The method can include the following operations. First, a structure of a plurality first layers and a plurality of second layers can be formed to alternatingly arrange over a substrate. A semiconductor channel can be formed in the structure. The semiconductor channel can extend from a top surface of the structure to the substrate. The plurality of second layers can then be replaced with a plurality of gate electrodes, and the plurality of first layers can be removed. A sealing structure can then be formed to insulate the plurality of gate electrodes from one another. Further, a source structure can be formed in the sealing structure. The source structure can extend from the top surface of the structure to the substrate.

In still another example, a 3D memory device is disclosed. The 3D memory device can include a structure of a plurality of gate electrodes insulated by a sealing structure over a substrate. The sealing structure can include an airgap between adjacent gate electrodes along a direction perpendicular to a top surface of the substrate. The 3D memory device can also include a semiconductor channel extending from a top surface of the structure to the substrate. The semiconductor channel can include a memory layer that has two portions extending along different directions. The 3D memory device can further include a source structure extending from the top surface of the structure to the substrate and between adjacent gate electrodes along a direction parallel to the top surface the substrate.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

FIGS. 2A-2D illustrate structures of a 3D memory device at various stages of an exemplary fabrication process, according to some embodiments of the present disclosure.

FIGS. 3A-3H illustrate structures of a 3D memory device at various stages of another exemplary fabrication process, according to some embodiments of the present disclosure.

Figure 1:
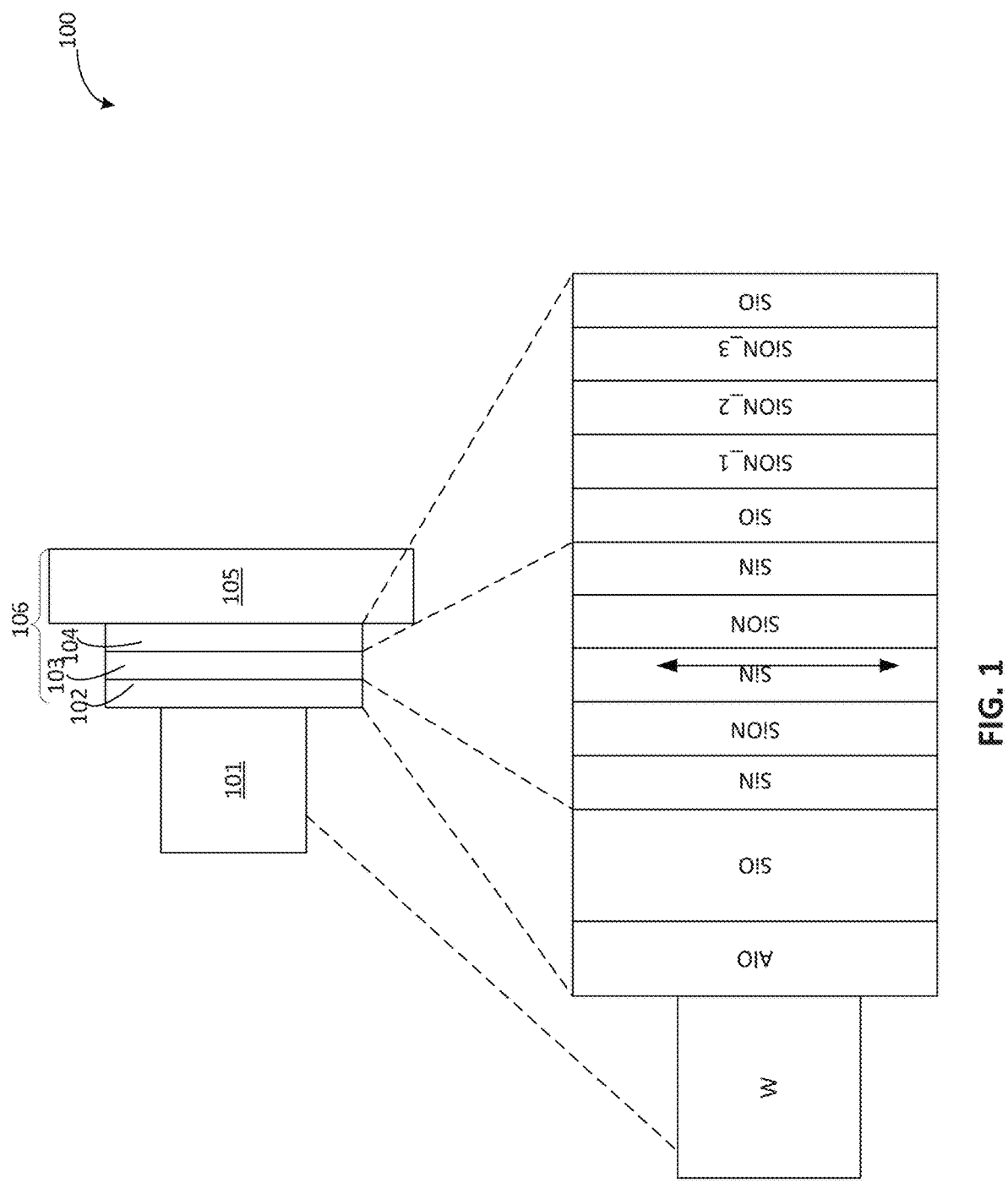
FIG. 1 illustrates a cross-sectional view of a portion of a 3D memory device.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more"

as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend laterally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

As used herein, the terms "staircase," "step," and "level" can be used interchangeably. As used herein, a staircase structure refers to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "staircase" refers to a vertical shift in the height of a set of adjoined surfaces.

As used herein, the x axis and the y axis (perpendicular to the x-z plane) extend horizontally and form a horizontal plane. The horizontal plane is substantially parallel to the top surface of the substrate. As used herein, the z axis extends vertically, i.e., along a direction perpendicular to the horizontal plane. The terms of "the x axis" and "the y axis" can be interchangeably used with "a horizontal direction," the term of "the x-y plane" can be interchangeably used with "the horizontal plane," and the term of "the z axis" can be interchangeably used with "the vertical direction."

In some 3D memory devices, a semiconductor channel is formed with a channel-forming structure, which includes a blocking layer, a memory layer, a tunneling layer, a semiconductor channel layer, and a dielectric core. Often, the blocking layer, the memory layer, the tunneling layer, and the semiconductor channel layer are sequentially arranged between a gate electrode and the dielectric core. Each one of the blocking layer, the memory layer, and the tunneling layer can include a single-layered structure or a multiple-layered structure. The blocking layer can reduce leakage of electrical charges. The memory layer can trap electric charges, which can tunnel into the semiconductor channel layer and can be transported in the semiconductor layer.

However, as more gate electrodes are stacked over the substrate (e.g., along a semiconductor channel) for higher memory capacity, charge loss becomes more prominent. For example, the memory layer can be more susceptible to charge loss as the number of gate electrodes increases. The charges trapped in the memory layer can be more likely to spread in the memory layer (e.g., along its extending direction.) As a result, data retention in the memory layer can be impaired, and operations (e.g., read, write, and/or hold) on the memory cells may have reduced precision.

It is understood that 3D memory device 100 can include additional components and structures not shown in FIG. 1 including, but not limited to, other local contacts and interconnects in one or more BEOL interconnect layers.

FIG. 1 illustrates a cross-section view of a portion of a 3D memory device 100. As shown in FIG. 1, a gate electrode 101 forms contact with a semiconductor channel. For viewing simplicity, a portion of semiconductor channel is depicted, shown as element 106. Semiconductor channel 106 has a blocking layer 102, a memory layer 103, a tunneling layer 104, and a p-channel 105, stacked sequentially along a direction (e.g., the x direction or the horizontal direction) substantially perpendicular to the direction p-channel 105 (e.g., or semiconductor channel 106) extends (e.g., the z direction or the vertical direction). P-channel 105? can include a semiconductor channel layer and a dielectric core, where the semiconductor channel layer is positioned between tunneling layer 104 and the dielectric core.

Gate electrode 101 can include any suitable conductive material such as tungsten (W). Each one of blocking layer 102, memory layer 103, and tunneling layer 104 can include a single-layered structure or a multiple-layered structure. For example, blocking layer 102 can include a high-k aluminum oxide (AlO or $Al_2O_3$) layer, a silicon oxide (SiO) layer, and/or a silicon oxynitride (SiON) layer sequentially stacked along the horizontal direction for reducing leakage of charges. Memory layer 103 can include a SiN layer, a SiON layer, a SiN layer, a SiON layer, and/or a SiN layer sequentially stacked along the horizontal direction for trapping charges. Tunneling layer 104 can include a SiO layer, one or more SiON layers (e.g., SiON_1, SiON_2, and SiON_3), and/or a SiO layer sequentially stacked along the horizontal direction for facilitating tunneling of charges from memory layer 103 to p-channel 105. The semiconductor channel layer can include a semiconductor layer such as poly-silicon for facilitating charge transport. The dielectric core can include a dielectric material such as silicon oxide to insulate each memory cell from one another.

As shown in FIG. 1, as the number of gate electrodes 101 increases along the vertical direction, charges trapped in memory layer 103 are more likely to spread along the vertical direction, as indicated by the arrow. Especially, charges are more likely to spread in the SiN layer, impairing the data retention of the 3D memory device. The impaired data retention can reduce the precision of operations (e.g., read, write, and/or hold) of the 3D memory device.

Various embodiments in accordance with the present disclosure provide the structures and fabrication methods of 3D memory devices, which resolve the above-noted issues associated with charge loss. For example, by changing the structure of the memory layer, charge spreading in the memory layer along its extending direction can be suppressed, improving charge confinement in the memory layer. Accordingly, data retention of the 3D memory device can be improved. In some embodiments, the memory layer can have portions aligned with its extending direction and portions misaligned from its extending direction (e.g., portions extending horizontally and vertically.) For example, the memory layer can have a staggered structure. This configuration can suppress the charges trapped in the memory cell to spread in the memory cell along its extending direction, increasing the data retention in the 3D memory device.

In some embodiments, portions of the blocking layer are reduced or removed. In some embodiments, portions of the blocking layer are moved to expose portions of the memory layer, and adjacent gate electrodes are insulated by an insulating spacer with an air gap. In some embodiments, portions of the memory layer are removed to disconnect other portions of the memory layer. Each disconnected portion of memory cell can be positioned between a gate electrode and the tunneling layer, facilitating the proper functions of each memory cell. The disconnected portions of memory cell can be insulated from other parts of the 3D memory device by the insulating spacer with an air gap.

Thus, the 3D memory devices formed employing the disclosed methods can have improved data retention and thus better operating precision.

Figure 4A:
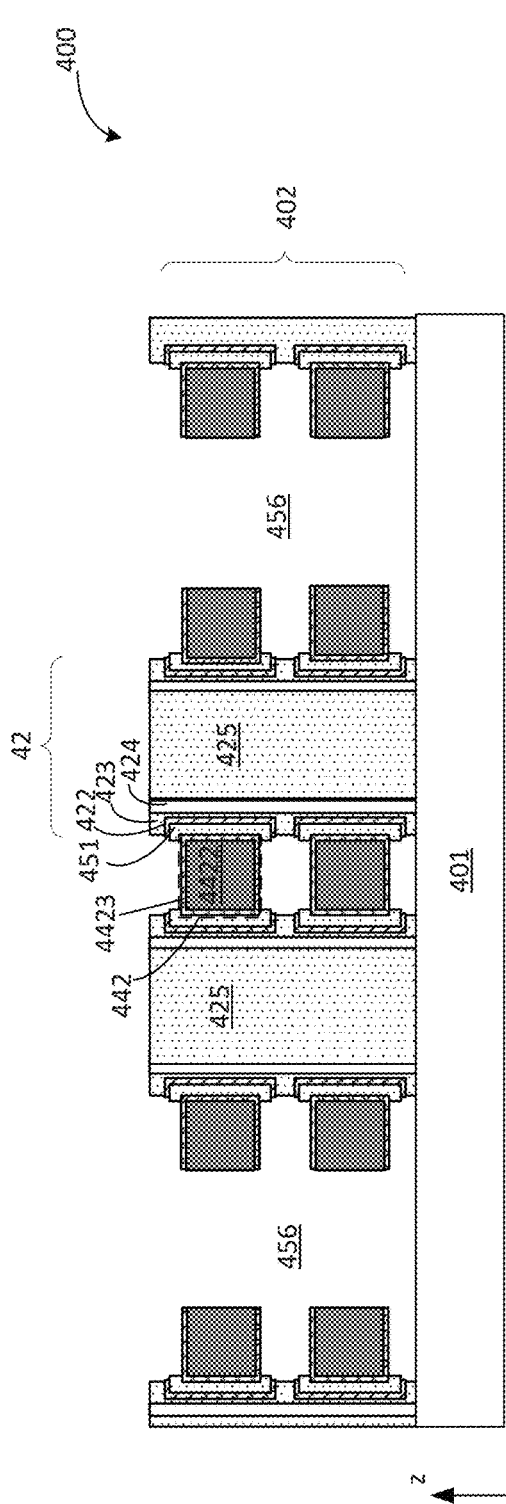
FIGS. 4A-4C illustrate structures of a 3D memory device at various stages of another exemplary fabrication process, according to some embodiments of the present disclosure.
Figure 4B:
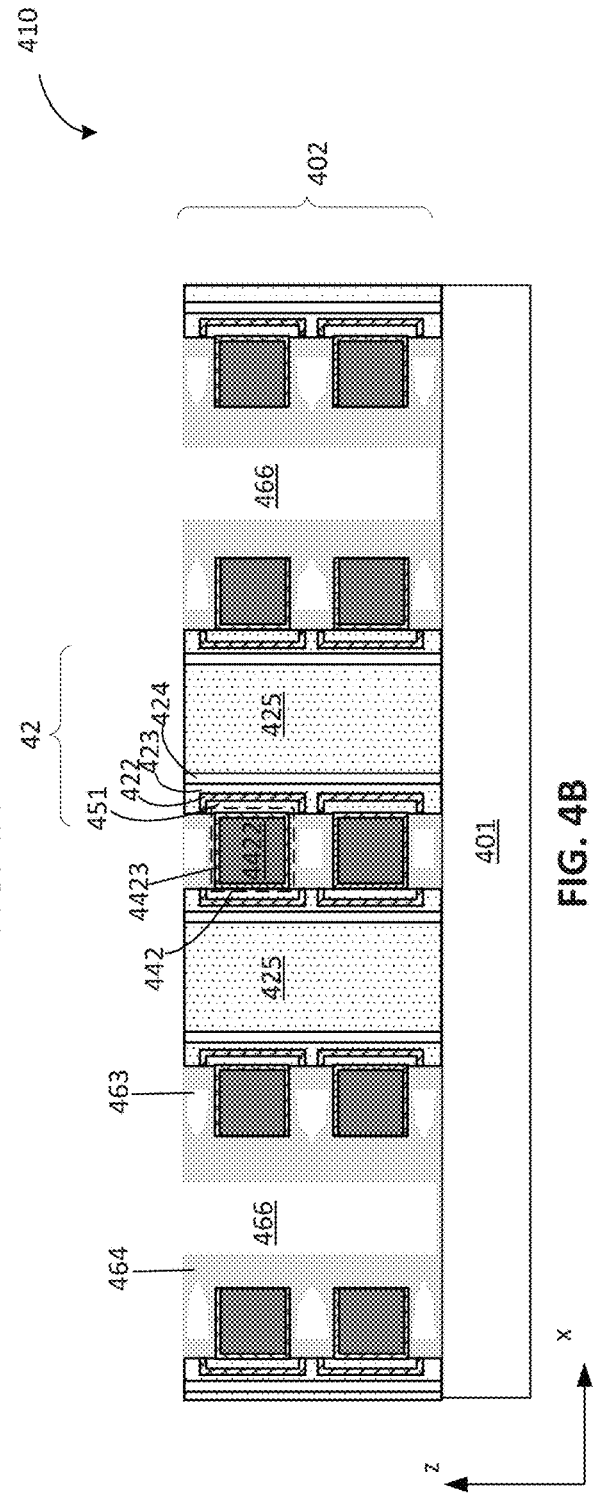
Figure 4C:
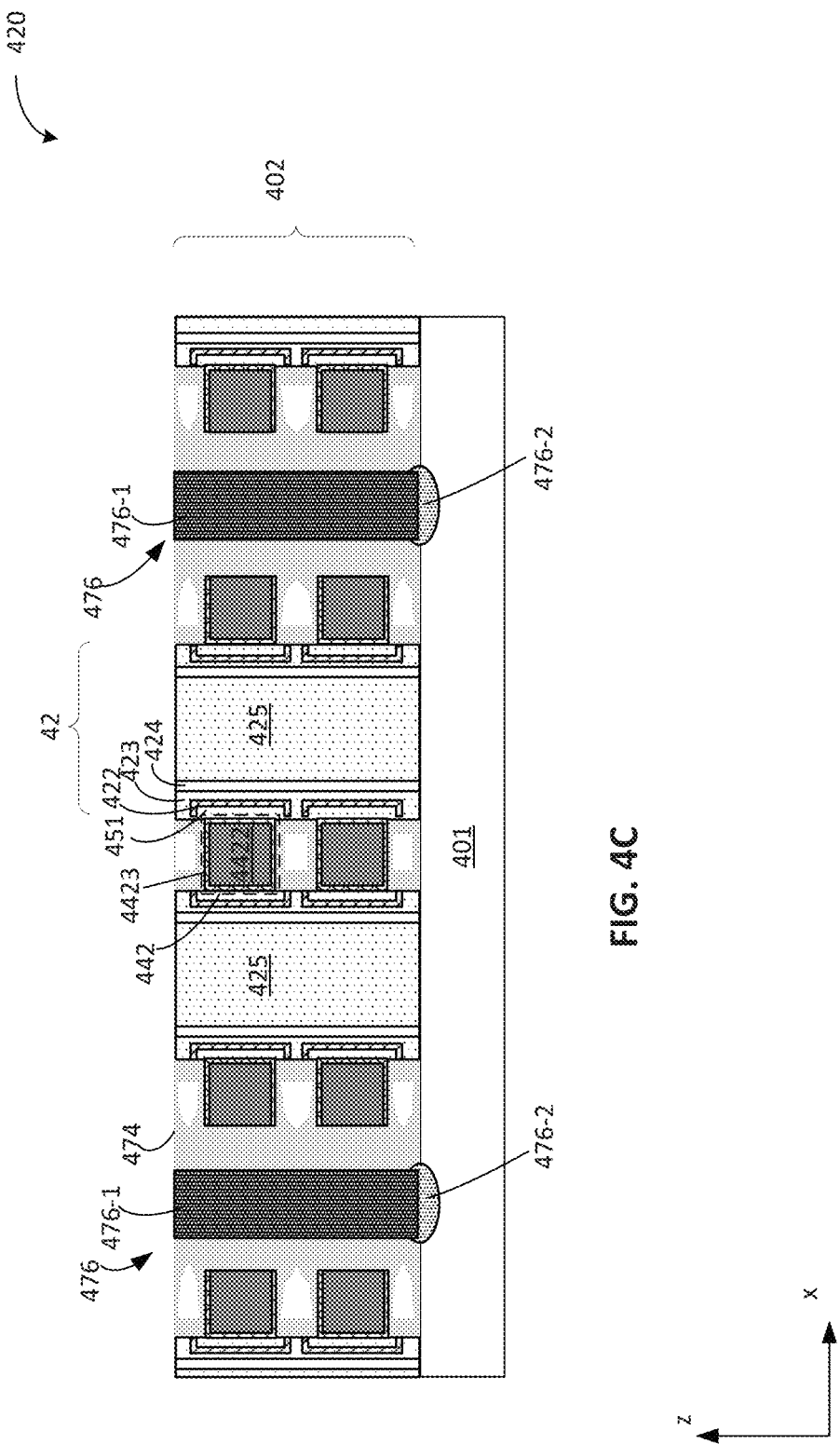
Figure 5A:
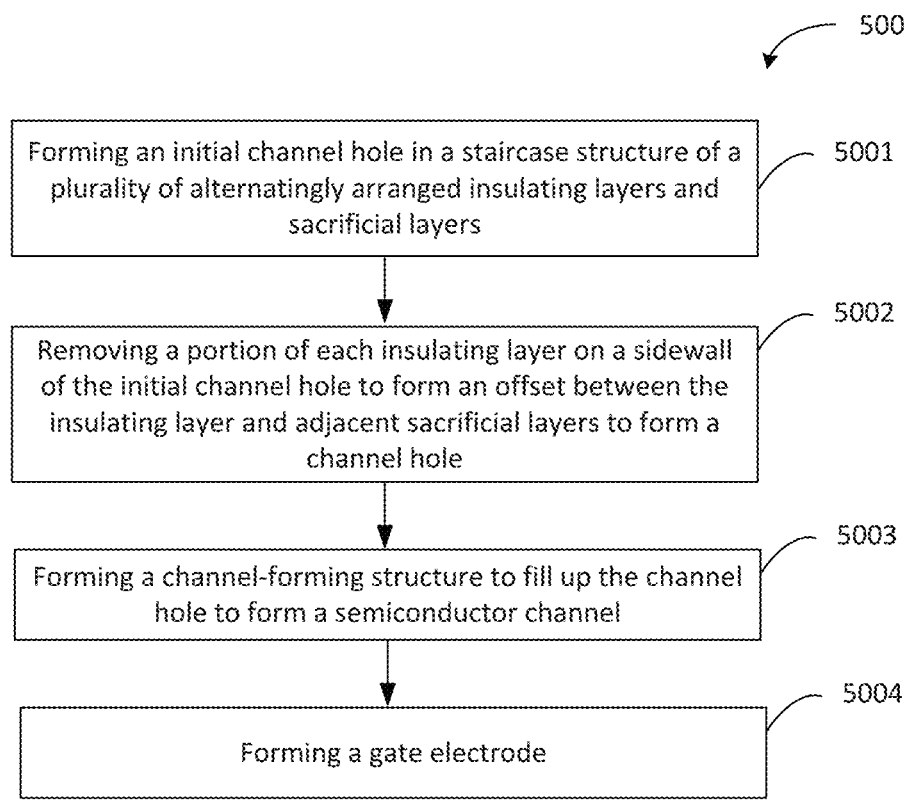
FIGS. 5A-5C each illustrates a flowchart of an exemplary method for forming a 3D memory device, according to some embodiments of the present disclosure.
Figure 5B:
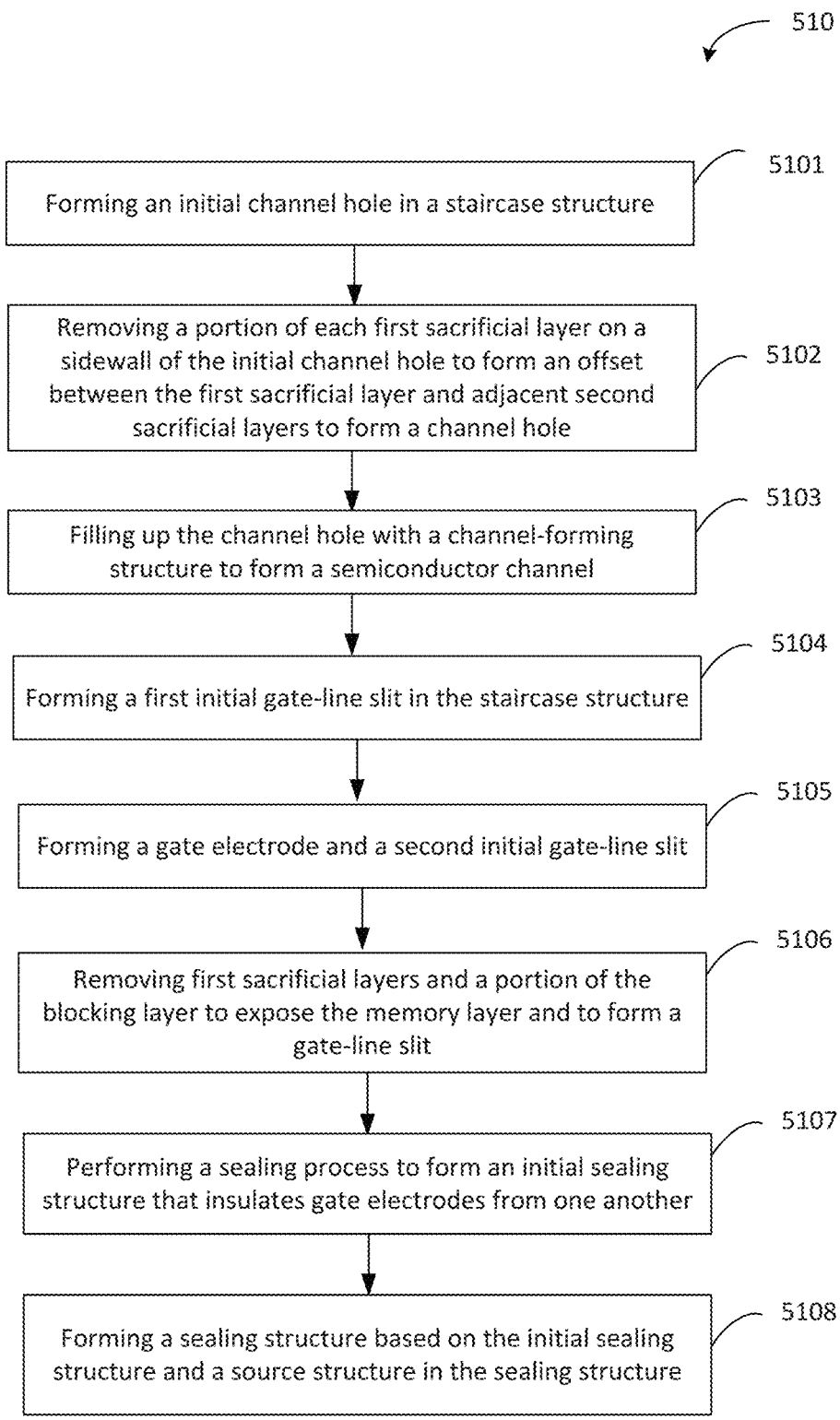
Figure 5C:
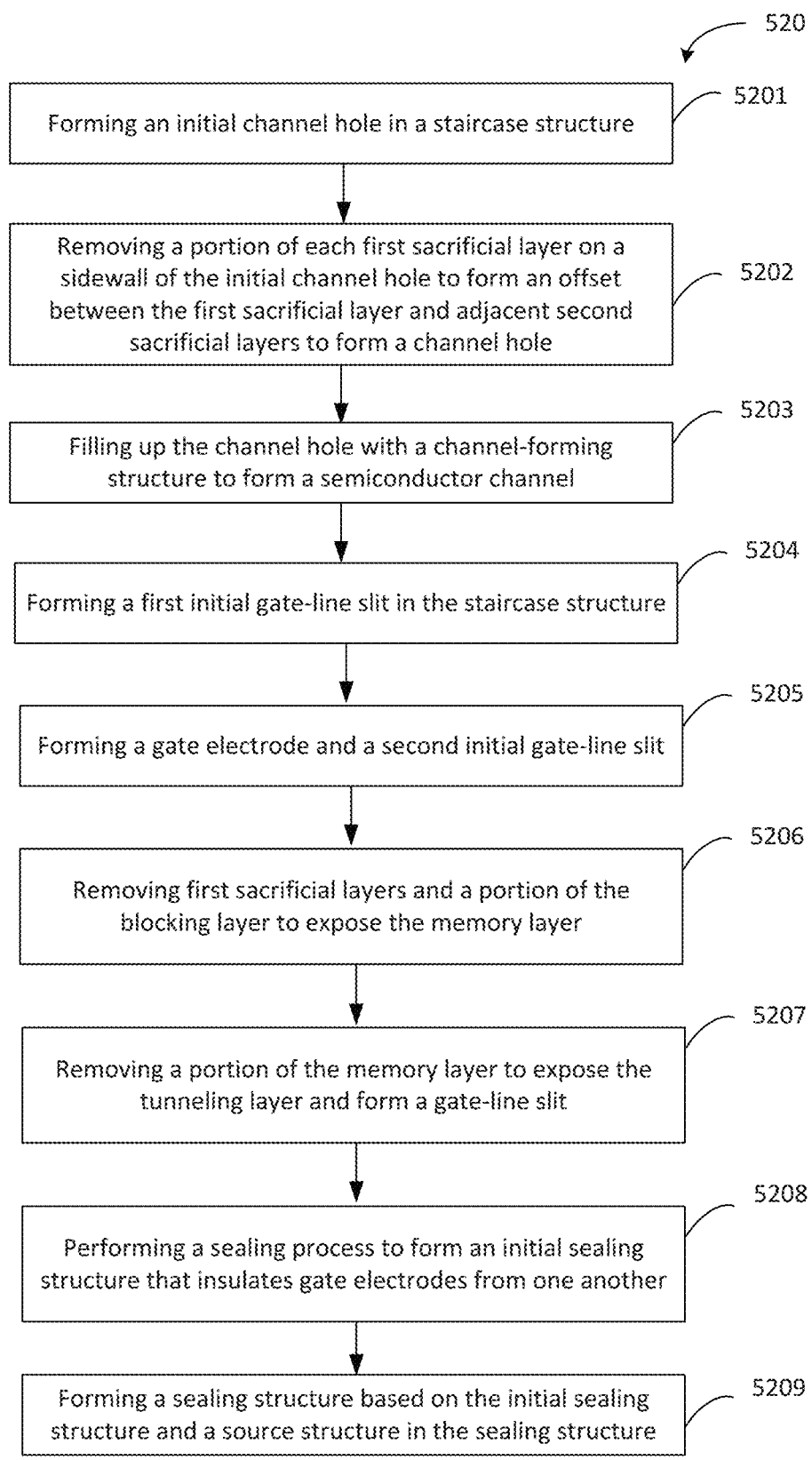

FIGS. 2A-2D illustrate structures 200-240 of an exemplary 3D memory device at various stages of an exemplary fabrication process, according to embodiments of the present disclosure. FIG. 5A illustrate an exemplary fabrication process 500 to form the 3D memory device illustrated in FIGS. 2A-2D. FIGS. 3A-3H illustrate structures 300-370 of an exemplary 3D memory device at various stages of an exemplary fabrication process, according to embodiments of the present disclosure. FIGS. 4A-4C illustrate structures 400-420 of an exemplary 3D memory device at various stages of another exemplary fabrication process, according to embodiments of the present disclosure. FIGS. 5B and 5C each illustrates an exemplary fabrication process to form a 3D memory device illustrated in FIGS. 3A-3H and 4A-4C.

Referring to FIG. 5A, at the beginning of the fabrication process, an initial channel hole can be formed in a staircase structure of a plurality of alternatingly arranged insulating layers and sacrificial layers (Operation 5001). FIG. 2A illustrates a cross-sectional view of a corresponding structure 200.

As shown in FIG. 2A, an initial channel hole 203 can be formed in a staircase structure 202, which is formed over a substrate 201. Substrate 201 can include silicon (e.g., single crystalline silicon), silicon germanium (SiGe), gallium arsenide (GaAs), germanium (Ge), silicon on insulator (SOI), and/or any other suitable materials. In some embodiments, substrate 201 includes silicon.

Staircase structure 202 can provide the fabrication base for the formation of a stacked storage structure. Memory strings (e.g., NAND memory strings) can be subsequently formed in staircase structure 202. In some embodiments, staircase structure 202 includes a plurality of insulating layer 2021/sacrificial layer 2022 pairs stacked vertically over substrate 201. Each insulating layer 2021/sacrificial layer 2022 pair can include an insulating layer 2021 and a sacrificial layer 2022. That is, staircase structure 202 can include interleaved insulating layers 2021 and sacrificial layers 2022 stacked along the vertical direction. The number of insulating layer 2021/sacrificial layer 2022 pairs in staircase structure 202 (e.g., 32, 64, 96, or 128) can set the number of memory cells in the 3D memory device.

Insulating layers 2021 can each have the same thickness or have different thicknesses. Similarly, sacrificial layers 2022 can each have the same thickness or have different thicknesses. Sacrificial layers 2022 can include any suitable materials that are different from the material of insulating layers 2021. In some embodiments, insulating layers 2021 include a suitable dielectric material such as SiO, and sacrificial layers 2022 include SiN. In some embodiments, each stair or step includes an insulating layer 2021 and a corresponding sacrificial layer 2022.

Staircase structure 202 can be formed by, e.g., repetitively etching a dielectric stack of a plurality of insulating material layer/sacrificial material layer pairs vertically. The etching of the insulating material layer/sacrificial material layer pairs can include repetitively etching/trimming an etch mask (e.g., a photoresist layer) over the dielectric stack to expose the portion of insulating material layer/sacrificial material layer pair to be etched, and etching/removing the exposed portion using a suitable etching process. The etching of the etch mask and the insulating material layer/sacrificial material layer pairs can be performed using any suitable etching processes such as wet etch and/or dry etch. In some embodiments, the etching includes dry etch, e.g., inductively coupled plasma etching (ICP) and/or reactive-ion etch (RIE).

An initial channel hole 203 can be formed in staircase structure 202. In some embodiments, initial channel hole 203 extends from a top surface of staircase structure 202 to substrate 201. In some embodiments, a bottom portion of initial channel hole 203 exposes substrate 201. Initial channel hole 203 can be formed by any suitable fabrication process. For example, a patterned photoresist layer can be formed over staircase structure 202. The patterned photoresist layer can expose a portion of staircase structure 202 for forming initial channel hole 203. A suitable etching process can be performed to remove the portion of staircase structure 202 until substrate 201 is exposed. The etching process can include a dry etch and/or a wet etch such as ICP.

Referring to FIG. 5A, after the formation of the initial channel hole, a portion of each insulating layer on a sidewall of the initial channel hole can be removed to form an offset between the insulating layer and adjacent sacrificial layers to form a channel hole (Operation 5002). FIG. 2B illustrates a cross-sectional view of a corresponding structure 210.

As shown in FIG. 2B, a portion of each insulating layer 2021 on the sidewall of initial channel hole 203 can be removed to form channel hole 213. For ease of description, the surface of insulating layer 2021 (or sacrificial layer 2022) facing initial channel hole 203 or channel hole 213 is referred to as a side surface of insulating layer 2021 (or sacrificial layer 2022). In an embodiment, a recess region can be formed on the side surface of insulating layer 2021. Insulating layer 2021 after the recess etch can be referred to as recessed-insulating layer 2121. The dimension or thickness of the removed portion (e.g., along the horizontal direction) of insulating layer 2021 can be any suitable value that allows an offset to be formed between the side surface of sacrificial layer 2022 and recessed-insulating layer 2121. In some embodiments, the side surfaces of sacrificial layers 2022 form protrusions along the vertical direction (or the sidewall of channel hole 213.) Any suitable selective etching process (e.g., a recess etch) can be performed to form recessed-insulating layers 2121. In some embodiments, the selective etching process has a high etching selectivity of recessed-insulating layers 2121 over sacrificial layers 2022, causing little or no damage on sacrificial layers 2022. A wet etch and/or a dry etch can be performed as the selective etching process. In some embodiment, an RIE is performed as the selective etching process.

In some embodiments, instead of moving a portion of the side surface of each insulating layer 2021, a portion of the side surface of each sacrificial layer 2022 is removed to form an offset between a recessed-sacrificial layer and adjacent insulating layers 2021. Accordingly, protrusions of side surfaces of insulating layers 2021 can extend along the vertical direction.

Referring to FIG. 5A, after the formation of the channel hole, a channel-forming structure is formed to fill up the channel hole, and a semiconductor channel is formed (Operation 5003). FIG. 2C illustrates a cross-sectional view of a corresponding structure 220.

As shown in FIG. 2C, a semiconductor channel 22 can be formed by filling channel hole 213 with a channel-forming structure. The channel-forming structure can include a blocking layer 221, a memory layer 222, a tunneling layer 223, a semiconductor layer 224, and a dielectric core 225, positioned sequentially from the sidewall surface of channel hole 213 towards the center of channel hole 213.

Blocking layer 221 can reduce or prevent charges from escaping into the subsequently formed gate electrodes. Blocking layer 221 can include a single-layered structure or a multiple-layered structure. For example, blocking layer 221 can include a first blocking layer and a second blocking layer. The first blocking layer can be formed over the surface of channel hole 213 by any suitable conformal deposition method. The first blocking layer can include a dielectric material (e.g., a dielectric metal oxide.) For example, the first blocking layer can include a dielectric metal oxide having a sufficiently high dielectric constant (e.g., greater than 7.9.) Examples of the first blocking layer include AlO, hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, and/or alloys thereof. The first blocking layer can be formed by a suitable deposition method such as chemical vapor deposition (CVD), atomic layer deposition (ALD), pulsed laser deposition (PLD), and/or liquid source misted chemical deposition. In some embodiments, the first blocking layer includes AlO.

The second blocking layer can be formed over the first blocking layer and can include a dielectric material that is different from the first blocking layer. For example, the second blocking layer can include silicon oxide, silicon oxynitride, and/or silicon nitride. In some embodiments, the second blocking layer includes silicon oxide, which can be formed by any suitable conformal deposition method such as low pressure CVD (LPCVD), and/or ALD.

Memory layer 222 can include a charge-trapping material and can be formed over blocking layer 221. Memory layer 222 can include a single-layered structure or a multiple-layered structure. For example, memory layer 222 can include conductive materials and/or semiconductor such as tungsten, molybdenum, tantalum, titanium, platinum, ruthenium, alloys thereof, nanoparticles thereof, silicides thereof, and/or polycrystalline or amorphous semiconductor materials (e.g., polysilicon and amorphous silicon.) Memory layer 222 can also include one or more insulating materials such as SiN and/or SiON. In some embodiments, memory layer 222 includes a SiN layer sandwiched by SiON layers, which are further sandwiched by SiN layers. Memory layer 222 can be formed by any suitable deposition method such as CVD, ALD, and physical vapor deposition (PVD).

Tunneling layer 223 can include a dielectric material through which tunneling can occur under a suitable bias. Tunneling layer 223 can be formed over memory layer 222 and can include a single-layered structure or a multiple-layered structure and can include SiO, SiN, SiON, dielectric metal oxides, dielectric metal oxynitride, dielectric metal silicates, and/or alloys thereof. Tunneling layer 223 can be formed by a suitable deposition method such as CVD, ALD, and/or PVD. In some embodiments, tunneling layer 223 includes a plurality of SiON layers and a SiO layer, wherein the plurality of SiON layers is positioned between memory layer 222 and the SiO layer.

Semiconductor layer 224 can facilitate transport of charges and can be formed over tunneling layer 223. Semiconductor layer 224 can include one or more semiconductor materials such as a one-element semiconductor material, a III-V compound semiconductor material, a II-VI compound semiconductor material, and/or an organic semiconductor material. Semiconductor layer 224 can be formed by any suitable deposition method such as LPCVD, ALD, and/or metal-organic chemical vapor deposition (MOCVD). In some embodiments, semiconductor layer 224 includes a poly-silicon layer.

Dielectric core 225 can include a suitable dielectric material and can fill up the space in surrounded by semiconductor layer 224. In some embodiments, dielectric core 225 includes SiO (e.g., SiO of sufficiently high purity) and can be formed by any suitable deposition method such as CVD, LPCVD, ALD, and/or PVD.

Because of the offsets between the side surfaces of recessed-insulating layers 2121 and sacrificial layers 2022, memory layer 222 can include portions aligned along different directions than the vertical direction. In some embodiments, memory layer 222 includes one or more of vertical portions 2221 (e.g., substantially aligned along the vertical direction) and one or more non-vertical portions 2222 (e.g., horizontal portions that are substantially aligned along the horizontal direction) connected with one another. When the subsequently-formed 3D memory device (i.e., formed with memory layer 222) is in operation, a bias can be applied on the gate electrode, and charges can be trapped in memory layer 222. Because of the non-vertical portions 2222 of memory layer 222, the spreading of charges in memory layer 222 along the vertical direction can be reduced or eliminated. Retention of charges in memory layer 222 can be improved.

Referring to FIG. 5A, after the semiconductor channel is formed, a gate electrode can be formed (Operation 5004). FIG. 2D illustrates a cross-sectional view of a corresponding structure 230.

As shown in FIG. 2D, sacrificial layers 2022 can be removed and gate electrodes 232 can be formed. In some embodiments, gate electrodes 232 can each include a conductor layer 2322 surrounded by an insulating spacer layer 2323 (e.g., a gate dielectric layer). Conductor layers 2322 can include conductive materials including, but not limited to, tungsten (W), cobalt (Co), copper (Cu), aluminum (Al), polycrystalline silicon (polysilicon), doped silicon, silicides, or any combination thereof. Insulating spacer layers 2323 can include dielectric materials including, but not limited to, SiO, SiN, and/or SiON. In some embodiments, conductor layers 2322 include metals, such as W, and insulating spacer layers 2323 include SiO. Conductor layers 2322 and SiO can each be formed by any suitable deposition method such as CVD and/or ALD.

In some embodiments, sacrificial layers 2022 are removed by any suitable etching process such as wet etch and/or dry etch to form gate-forming tunnels. The etching process can have a sufficiently high etching selectivity, causing little or no damage on recessed-insulating layers 2121. In some embodiments, an RIE process is performed to remove sacrificial layers 2022. Further, insulating spacer layer 2323 can be deposited over the sidewall of the gate-forming tunnels by, e.g., CVD, ALD, and/or in-situ steam generation (ISSG). In some embodiments, the formation of insulating spacer layer 2323 includes deposition of a high-k dielectric material (such as AlO, $HfO_2$, and/or $Ta_2O_5$) over the sidewall of the gate-forming tunnels and an adhesive layer (such as titanium nitride (TiN)) over the high-k dielectric material. A conductive material can then be deposited over insulating spacer layers 2323 to fill up the gate-forming tunnels and form conductor layers 2322. Gate electrodes 232 can then be formed.

In some embodiments, staircase structure 202 can include a plurality of insulating layers 2021 and conductive layers alternatingly arranged over substrate 201. For example, the conductive materials can have the same positions as sacrificial layers 2022. The conductive material can include, e.g., doped poly-silicon. A similar fabrication process can be performed, as shown in FIGS. 2A-2C, to form a plurality of semiconductor channels 22 in staircase structure 202. The conductive layers can function as gate electrodes.

In some embodiments, elements 2021 and 2022 represent insulating material layer and sacrificial material layer, and staircase structure 202 represents a dielectric stack. In this case, dielectric stack 202 can be etched/patterned repetitively to form stairs, where each stair can include an insulating layer/sacrificial layer pair. The insulating layer and the sacrificial layer can each be formed by the etching/patterning of dielectric stack 202. The formation of insulating layer/sacrificial layer pairs can be formed at any suitable stage before the formation of the gate electrodes. The specific order to form the staircases, the semiconductor channels, and the gate electrodes should not be limited by the embodiments of the present disclosure.

FIG. 5B illustrates an exemplary fabrication process 510 to form another 3D memory device, according to some embodiments. FIGS. 3A-3H illustrate cross-sectional views of the 3D memory device at different stages of the fabrication process.

Referring to FIG. 5B, at the beginning of the fabrication process, an initial channel hole can be formed in a staircase structure (Operation 5101). FIG. 3A illustrates a cross-sectional view of a corresponding structure 300.

As shown in FIG. 3A, an initial channel hole 303 can be formed in a staircase structure 302, which is formed over a substrate 301. Substrate 301 can be similar to or the same as substrate 201. In some embodiments, substrate 201 includes silicon.

Staircase structure 302 can provide the fabrication base for the formation of a stacked storage structure. Memory strings (e.g., NAND memory strings) can be subsequently formed in staircase structure 302. In some embodiments, staircase structure 302 includes a plurality of first sacrificial layer 3021/second sacrificial layer 3022 pairs stacked vertically over substrate 301. Each first sacrificial layer 3021/second sacrificial layer 3022 pair can include a first sacrificial layer 3021 and a second sacrificial layer 3022. That is, staircase structure 302 can include interleaved first sacrificial layers 3021 and second sacrificial layers 3022 stacked along the vertical direction. The number of first sacrificial layer 3021/second sacrificial layer 3022 pairs in staircase structure 302 (e.g., 32, 64, 96, or 128) can set the number of memory cells in the 3D memory device.

First sacrificial layers 3021 can each have the same thickness or have different thicknesses. Similarly, second sacrificial layers 3022 can each have the same thickness or have different thicknesses. Second sacrificial layers 3022 can include any suitable materials that are different from the material of first sacrificial layers 3021. In some embodiments, first sacrificial layer 3021 includes one or more of poly-silicon and carbon. In some embodiments, second sacrificial layer 3022 includes SiN. In some embodiments, each stair or step includes a first sacrificial layer 3021 and a corresponding second sacrificial layer 3022.

The formation of first sacrificial layer 3021/second sacrificial layer 3022 can be formed by repetitive etching of a stack of first sacrificial material layer/second sacrificial material layer pairs using an etch mask (e.g., a photoresist layer) over the stack. The etch mask can expose the portion of first sacrificial material layer 3021/second sacrificial layer 3022 pair to be etched so that the exposed portion can be etched using a suitable etching process. The etching of the etch mask and the stack can be performed using any suitable etching processes such as wet etch and/or dry etch. In some embodiments, the etching includes dry etch, e.g., inductively coupled plasma etching (ICP) and/or reactive-ion etch (RIE).

An initial channel hole 303 can be formed in staircase structure 302. In some embodiments, initial channel hole 303 extends from a top surface of staircase structure 302 to substrate 301. In some embodiments, a bottom portion of initial channel hole 303 exposes substrate 301. Initial channel hole 303 can be formed by any suitable fabrication process. For example, a patterned photoresist layer can be formed over staircase structure 302. The patterned photoresist layer can expose a portion of staircase structure 302 for forming initial channel hole 303. A suitable etching process can be performed to remove the portion of staircase structure 302 until substrate 301 is exposed. The etching process can include a dry etch and/or a wet etch such as ICP.

Referring to FIG. 5B, after the formation of the initial channel hole, a portion of each first sacrificial layer on a sidewall of the initial channel hole can be removed to form an offset between the first sacrificial layer and adjacent second sacrificial layers to form a channel hole (Operation 5102). FIG. 3B illustrates a cross-sectional view of a corresponding structure 310.

As shown in FIG. 3B, a portion of each first sacrificial layer 3021 on the sidewall of initial channel hole 303 can be removed to form channel hole 313. For ease of description, the surface of first sacrificial layer 3021 (or second sacrificial layer 3022) facing initial channel hole 303 or channel hole 313 is referred to as a side surface of first sacrificial layer 3021 (or second sacrificial layer 3022). In an embodiment, a recess region can be formed on the side surface of first sacrificial layer 3021. First sacrificial layer 3021 after the recess etch can be referred to as recessed-first sacrificial layer 3121. The dimension or thickness of the removed portion (e.g., along the horizontal direction) of first sacrificial layer 3021 can be any suitable value that allows an offset to be formed between the side surface of second sacrificial layer 3022 and recessed-first sacrificial layer 3121. In some embodiments, the side surfaces of second sacrificial layers 3022 form protrusions along the vertical direction (or the sidewall of channel hole 313.) Any suitable selective etching process (e.g., a recess etch) can be performed to form recessed-first sacrificial layers 3121. In some embodiments, the selective etching process has a high etching selectivity on recessed-first sacrificial layers 3121 over second sacrificial layers 3022, causing little or no damage on second sacrificial layers 3022. A wet etch and/or a dry etch can be performed as the selective etching process. In some embodiment, an RIE is performed as the selective etching process.

In some embodiments, instead of moving a portion of the side surface of each first sacrificial layer 3021, a portion of the side surface of each second sacrificial layer 3022 is removed to form an offset between a recessed-second sacrificial layer and adjacent first sacrificial layers 3021. Accordingly, protrusions of side surfaces of first sacrificial layers 3021 can extend along the vertical direction.

Referring to FIG. 5B, after the formation of the channel hole, a channel-forming structure is formed to fill up the channel hole, and a semiconductor channel is formed (Operation 5103). FIG. 3C illustrates a cross-sectional view of a corresponding structure 320.

As shown in FIG. 3C, a channel-forming structure can be formed in channel hole 313 to form a semiconductor channel 32. Similar to semiconductor channel 22 illustrated in FIG. 2C, the channel-forming structure includes a blocking layer 321, a memory layer 322, a tunneling layer 323, a semiconductor layer 324, and a dielectric core 325. In some embodiments, blocking layer 321, memory layer 322, tunneling layer 323, semiconductor layer 324, and dielectric core 325 can respectively be similar to or the same as blocking layer 221, memory layer 222, tunneling layer 223, semiconductor layer 224, and dielectric core 525. Details of the structure and formation methods of the channel-forming structure can be referred to the description of FIG. 2C.

Referring to FIG. 5B, after the formation of the semiconductor channel, a first initial gate-line slit can be formed in the staircase structure (Operation 5104). FIG. 3D illustrates a cross-sectional view of a corresponding structure 330.

As shown in FIG. 3D, first initial gate-line slit 336 can be formed in staircase structure 302. In some embodiments, first initial gate-line slit 336 extends along a direction perpendicular to the x-z plane (e.g., the y axis) and divide semiconductor channels 32 into blocks along the y axis. First initial gate-line slit 336 can extend from a top surface of staircase structure 302 to substrate 301. In some embodiments, first initial gate-line slit 336 exposes substrate 301. First initial gate-line slit 336 can be formed by any suitable method. For example, first initial gate-line slit 336 can be formed by etching of staircase structure 302 using an etch mask (e.g., a patterned photoresist layer). The etch mask can expose a portion of staircase structure 302 that corresponds to a location of first initial gate-line slit 336. A suitable etching process (e.g., dry etch and/or wet etch) can be performed to remove the exposed portion of staircase structure 302 until substrate 301 is exposed. In some embodiments, an ICP etching is performed to form first initial gate-line slit 336.

Referring to FIG. 5B, after the formation of first initial gate-line slit, a gate electrode and a second initial gate-line slit can be formed (Operation 5105). FIG. 3E illustrates a cross-sectional view of a corresponding structure 340.

As shown in FIG. 3E, second sacrificial layers 3022 can be removed and gate electrodes 342 can be formed. Gate electrode 342 can include a conductor layer 3422 surrounded by an insulating spacer layer 3423. Second sacrificial layers 3022 can be removed by any suitable etching process (e.g., wet etch and/or dry etch). In some embodiments, second sacrificial layers 3022 are removed by a wet etch process to form gate-forming tunnels. An insulating spacer layer 3423 can then be deposited on the sidewalls of the gate-forming tunnels. In some embodiments, the formation of insulating spacer layer 3423 includes deposition of a high-k dielectric material (such as AlO, $HfO_2$, and/or $Ta_2O_5$) over the sidewall of the gate-forming tunnels and an adhesive layer (such as titanium nitride (TiN)) over the high-k dielectric material. A conductive material can then be deposited over insulating spacer layers 3423 to fill up the gate-forming tunnels and form conductor layers 3422. Conductor layers 3422 can be similar to or the same as conductor layers 2322. The structure and formation of conductor layers 3422 can be referred to the description of conductor layers 2322 of FIG. 2D. Gate electrodes 342 can then be formed.

A recess etch can be performed to remove any excessive materials that form insulating spacer layer 3423 and conductor layers 3422 in first initial gate-line slit 336. For example, excessive material of insulating spacer layer 3423 and conductive material can be removed from recessed-first sacrificial layers 3121 and substrate 301 at the bottom of first initial gate-line slit 336. Second initial gate-line slit 346 that exposes substrate 301 can be formed. In some embodiments, portions of insulating spacer layer 3423 can be removed to expose conductor layers 3422 on the sidewall of second initial gate-line slit 346. The recess etch can include any suitable etching process (e.g., wet etch and/or dry etch). In some embodiments, the recess etch includes a wet etch process.

Referring to FIG. 5B, after the formation of gate electrodes and second initial gate-line slit, first sacrificial layers and a portion of the blocking layer can be removed to expose the memory layer, and a gate-line slit can be formed (Operation 5106). FIG. 3F illustrates a cross-sectional view of a corresponding structure 350.

As shown in FIG. 3F, recessed-first sacrificial layers 3121 and a portion of blocking layer 321 can be removed to expose memory layer 322 and substrate 301, and gate-line slit 356 can be formed. In some embodiments, the portion of blocking layer 321 can be removed to expose the vertical portion of memory layer 322. The remaining portion of blocking layer 321 can be depicted as a disconnected blocking layer 351 in FIG. 3F. Gate-line slit 356 can then expose the gate electrodes 342, the vertical portion of memory layer 322, and substrate 301.

One or more etching processes can be performed to remove recessed-first sacrificial layers 3121 and the portion of blocking layer 321. The etching processes can have sufficiently high etching selectivity of recessed-first sacrificial layers 3121 and/or blocking layer 321 over memory layer 322. For example, memory layer 322 can function as an etch-stop layer so the sidewall of semiconductor channel 32 has little or no damage from the formation of gate-line slit 356. In some embodiments, disconnected blocking layer 351 has sufficient thickness to surround gate electrode 342 and insulate gate electrode 342 from memory layer 322. The one or more etching processes can include any suitable etching processes such as a dry etch and/or a wet etch.

Referring to FIG. 5B, after the formation of gate line slits, a sealing process can be performed to form an initial sealing structure that insulates gate electrodes from one another (Operation 5107). FIG. 3G illustrates a cross-sectional view of a corresponding structure 360.

As shown in FIG. 3G, an initial sealing structure 364 can be formed to surround each gate electrode so gate electrodes are insulated from one another. The portion of initial sealing structure 364 surrounding each gate electrode can be sufficiently thick to ensure the surrounded gate electrode 342 (e.g., along the horizontal direction and the vertical direction) is insulated from other structures (e.g., other gate electrodes 342.) In some embodiments, initial sealing structure 364 includes an airgap 363 formed between adjacent gate electrodes 342 to further insulate adjacent gate electrodes 342 from one another. In some embodiments, airgap 363 may be embedded in initial sealing structure 364 and between adjacent gate electrodes 342. In some embodiments, initial sealing structure 364 also covers the exposed disconnected blocking layer 351, memory layer 322, and the top surface of semiconductor channel 32.

An initial source trench 366 can be formed by the space (e.g., in gate-line slit 356) formed after the formation of initial sealing structure. In some embodiments, initial source trench 366 is surrounded by a sufficient portion of initial sealing structure 364 (e.g., along the horizontal direction) so the subsequently-formed source structure is insulated from gate electrodes 342. In some embodiments, initial source trench 366 extends along a direction perpendicular to the x-z plane (e.g., the y axis.)

Initial sealing structure 364 and initial source trench 366 may be formed by the following process. A sealing process can be performed to form initial sealing structure 364 that surrounds/covers each gate electrode with sufficient thickness so the gate electrodes 342 can be insulated from one another. Air may be trapped by the initial sealing structures between gate electrodes 342. The initial sealing structure may also cover the exposed disconnected blocking layer 351, memory layer 322, and the top surface of semiconductor channel 32. Initial source trench 366 can be formed accordingly by the space (e.g., in gate-line slit 356) formed after the formation of initial sealing structure 364.

Initial sealing structure 364 can be formed by any suitable deposition method that forms an insulating material over gate electrodes 342 and forms airgap 363 between adjacent gate electrodes 342. The insulating material may include any suitable material that provides electrical insulation between adjacent gate electrodes 342 and between gate electrode 342 and the subsequently-formed source structure. In some embodiments, initial sealing structure 364 is formed by a rapid thermal CVD and the initial sealing structure includes silicon oxide. In various applications, the rapid thermal CVD can also be referred to as a "rapid sealing" process. In some embodiments, airgap 363 is not formed between adjacent gate electrodes 342. That is, space between adjacent gate electrodes 342 can also be filled with the insulating material. Optionally, a planarization/recess etch process can be performed or remove excessive portions of the initial sealing structure over semiconductor channels 32 and/or gate electrodes 342.

Referring to FIG. 5B, after the initial sealing structure and the initial source trench are formed, a sealing structure is formed based on the initial sealing structure and a source structure is formed in the sealing structure (Operation 5108). FIG. 3H illustrates a cross-sectional view of a corresponding structure 370.

As shown in FIG. 3H, a source structure 376 can be formed in sealing structure 374 (e.g., between adjacent gate electrodes 342 and can extend along a direction perpendicular to the x-z plane (e.g., the y axis).) Source structure 376 can include a conductor portion 376-1 and a doped semiconductor portion 376-2. Doped semiconductor portion 376-2 can be formed in substrate 301, contacting conductor portion 376-1. Source structure 376 may be insulated from neighboring gate electrodes 342 by initial sealing structure 364. Conductor portion 376-1 may include any suitable conductive material that can be used as the source electrode, and doped semiconductor portion 376-2 may include a suitable doped (e.g., P type or N type) semiconductor region formed in substrate 301 and is opposite from the polarity of substrate 301. In some embodiments, conductor portion 376-1 includes one or more of doped poly-silicon, copper, aluminum, cobalt, doped silicon, silicides, and tungsten. In some embodiments, doped semiconductor portion 376-2 includes doped silicon.

Source structure 376 can be formed by filling up a source trench in initial sealing structure 364. The source trench can be formed by performing a patterning/etching process in initial sealing structure 364. In an example, a patterned photoresist layer can be formed over initial sealing structure 364. The patterned photoresist layer may have an opening that exposes the area where the source trench is subsequently formed. An etching process (e.g., a recess etching process) may be performed (e.g., using the patterned photoresist layer as an etch mask) to remove the portion of initial sealing structure 364 exposed by the opening to expose substrate 301. The source trench and sealing structure 374 can be formed accordingly. The etching process can also be referred to as a "bottom punch through" process and can include any etching process that can remove initial sealing structure 364. In some embodiments, the etching process includes an anisotropic dry etching process.

Source structure 376 may be formed by the following process. After the source trench is formed, an ion implantation may be performed to implant ions/dopants into the portion of substrate 301 exposed at the bottom of the source trench. The portion of substrate 301 doped by the ion implantation process can form doped semiconductor portion 376-2. In some embodiments, substrate 301 includes silicon and doped semiconductor portion 376-2 includes doped silicon. Conductor portion 376-1 can then be formed by filling the source trench with a suitable conductor material such as doped poly-silicon, copper, aluminum, and/or tungsten by a suitable deposition process such as CVD, ALD, PVD, etc. Optionally, a planarization/recess etch process can be performed to remove excessive portions of the conductor material over semiconductor channels 32 and/or gate electrodes 342. In some embodiments, source structure 376 is referred to as an array common source ("ACS".)

FIG. 5C illustrates an exemplary fabrication process 520 to form another 3D memory device, according to some embodiments. FIGS. 4A-4C illustrate cross-sectional views of the 3D memory device at different stages of the fabrication process. The 3D memory device may be formed based on structure 350 (illustrated in FIG. 3F) and the fabrication process to form structure 400 can be similar to or the same as the fabrication process to form structure 350. The structure and formation process of substrate 301, staircase structure 302, semiconductor channel 32, tunneling layer 323, semiconductor layer 324, dielectric core 325, disconnected blocking layer 351, gate electrode 342, conductor layer 3422, and insulating spacer layer 3423 may respectively be similar to or the same as substrate 401, staircase structure 402, semiconductor channel 42, tunneling layer 423, semiconductor layer 424, dielectric core 425, disconnected blocking layer 451, gate electrode 442, conductor layer 4422, and insulating spacer layer 4423. The memory layer described in FIGS. 4A-4C can be similar to or the same as memory layer 322 of FIG. 3F. The fabrication process to form structure 400 (Operations 5201-5206) may be the same as or similar to operations 5101-5106 and can be referred to the description of FIGS. 3A-3F. In some embodiments, gate-line slit 356 can be referred to as a third initial gate-line slit and the gate-line slit is formed after operation 5207 is formed.

Referring to FIG. 5C, after the memory layer is exposed, a portion of the memory layer is removed to expose the tunneling layer and a gate-line slit is formed (Operation 5207). FIG. 4A illustrates a cross-sectional view of a corresponding structure 400.

As shown in FIG. 4A, a portion of the memory layer (e.g., the portion over the tunneling layer) can be removed to expose the tunneling layer. Gate-line slit 456 can be formed. In some embodiments, a portion of the tunneling layer 423 and/or a portion of disconnected blocking layer 451 are removed by the etching process to have a recess top surface on the sidewall of gate-line slit 456. The remaining portion of memory layer is referred to as a disconnected memory layer 422. The top surfaces of disconnected blocking layer 451, disconnected memory layer 422, and tunneling layer 423 may or may not be coplanar with one another along the sidewall of gate-line slit 456. In some embodiments, after the formation of disconnected memory layer 422, disconnected blocking layer 451 partially surrounds gate electrode 442 and insulates gate electrode 442 from disconnected memory layer 422.

Any suitable etching process can be performed to form disconnected memory layer 422. In some embodiments, the etching process includes an isotropic etch (e.g., dry etch and/or wet etch.) In some embodiments, the etching process has a higher etching selectivity of the memory layer than other structures/layers (e.g., insulating spacer layer 4423, disconnected blocking layer 451, and tunneling layer 423.) In some embodiments, the etching time of the memory layer is controlled to ensure a sufficient portion of disconnected blocking layer 451 can remain to provide insulation between disconnected memory layer 422 and gate electrode 442.

Referring to FIG. 5C, after the formation of gate-line slit and the disconnected memory layer, a sealing process can be performed to form an initial sealing structure that insulates gate electrodes from one another (Operation 5208). FIG. 4B illustrates a cross-sectional view of a corresponding structure 410.

As shown in FIG. 4B, an initial sealing structure 464 can be formed to cover and insulate adjacent gate electrodes 442 and form an airgap 463, and an initial source trench 466 can be formed in initial sealing structure 464 by the space (e.g., in gate-line slit 456) formed after the formation of initial sealing structure. The fabrication processes and structures of initial sealing structure 464 and initial source trench 466 may be the same as or similar to the fabrication processes and structures of initial sealing structure 364 and initial source trench 366. Detailed description of initial sealing structure 464 and initial source trench 466 can be referred to the description of initial sealing structure 364 and initial source trench 366 in FIG. 3G.

Referring to FIG. 5C, after the formation of initial source trench and the initial sealing structure, a sealing structure is formed based on the initial sealing structure and a source structure is formed in the sealing structure (Operation 5209). FIG. 4C illustrates a cross-sectional view of a corresponding structure 420.

As shown in FIG. 4C, a source structure 476 can be formed in a sealing structure 474. Source structure 476 can be positioned between adjacent gate electrodes 442 and can extend along a direction perpendicular to the x-z plane (e.g., the y axis.) Source structure 476 can include a conductor portion 476-1 and a doped semiconductor portion 476-2. The fabrication processes and structures of source structure 476 and sealing structure 474 may be respectively the same as or similar to the fabrication process and structure of source structure 376 and sealing structure 374. Detailed description of source structure 476 and sealing structure 374 can be referred to the description of FIG. 3H.

In some embodiments, the disclosed 3D memory device is part of a monolithic 3D memory device, in which the components of the monolithic 3D memory device (e.g., memory cells and peripheral devices) are formed on a single substrate (e.g., substrate 201, 301, or 401). Peripheral devices such as any suitable digital, analog, and/or mixed-signal peripheral circuits used for facilitating the operation of the disclosed 3D memory device, can be formed on the substrate as well, outside of memory stack (e.g., memory stack formed in staircase structures 202, 302, or 402). The peripheral device can be formed "on" the substrate, where the entirety or part of the peripheral device is formed in the substrate (e.g., below the top surface of the substrate) and/or directly on the substrate. Peripheral device can include one or more of a page buffer, a decoder (e.g., a row decoder and a column decoder), a sense amplifier, a driver, a charge pump, a current or voltage reference, or any active or passive components of the circuits (e.g., transistors, diodes, resistors, or capacitors). Isolation regions (e.g., shallow trench isolations (STIs)) and doped regions (e.g., source regions and drain regions of the transistors) can be formed in the substrate as well, outside of the memory stack.

In some embodiments, a method for forming a 3D memory device includes the following operations. First, an initial channel hole can be formed in a staircase structure. The staircase structure can include a plurality first layers and a plurality of second layers alternatingly arranged over a substrate. An offset can be formed between a side surface of each one of the plurality of first layers and a side surface of each one of the plurality of second layers on a sidewall of the initial channel hole to form a channel hole. A semiconductor channel can then be formed based on the channel hole. Further, a plurality of gate electrodes can be formed based on the plurality of second layers.

In some embodiments, forming the initial channel hole in the staircase structure includes the following operations. First, a patterned photoresist layer can be formed over the staircase structure to expose an opening that corresponds to a location of the initial channel hole. A portion of the staircase structure can then be exposed by the opening to expose the substrate.

In some embodiments, forming the offset includes removing a portion of the side surface of each one of the plurality of first layers on the sidewall of the initial channel hole.

In some embodiments, removing the portion of the side surface of each one of the plurality of first layers includes performing a recess etching process that selectively etches the plurality of first layers to the plurality of second layers.

In some embodiments, forming the semiconductor channel includes filling the channel hole with a channel-forming structure that extends from a top surface of the staircase structure to the substrate.

In some embodiments, filling the channel hole with the channel-forming structure includes the following operations. First, a blocking layer is formed over a sidewall of the channel hole. A memory layer can be formed over the blocking layer. A tunneling layer can be formed over the memory layer. A semiconductor layer can then be formed over the tunneling layer. Further, a dielectric core can be formed over the semiconductor layer to fill up the channel hole.

In some embodiments, forming the blocking layer includes depositing at least one of a first blocking layer and a second blocking layer. The first blocking layer can include one or more of aluminum oxide (AlO), hafnium oxide (HfO$_2$), lanthanum oxide (LaO$_2$), yttrium oxide (Y$_2$O$_3$), tantalum oxide (Ta$_2$O$_5$), silicates thereof, nitrogen-doped compounds thereof, and alloys thereof. The second blocking layer can include one or more of silicon oxide, silicon oxynitride, and silicon nitride. In some embodiments, forming the memory layer can include depositing a charge-trapping material that includes at least one of tungsten, molybdenum, tantalum, titanium, platinum, ruthenium, alloys thereof, nanoparticles thereof, silicides thereof, polysilicon, amorphous silicon, SiN, and SiON. In some embodiments, forming the tunneling layer includes deposing at least one of SiO, SiN, SiON, dielectric metal oxides, dielectric metal oxynitride, dielectric metal silicates, and alloys thereof. In some embodiments, forming the semiconductor layer includes depositing a one-element semiconductor material, a III-V compound semiconductor material, a II-VI compound semiconductor material, and/or an organic semiconductor material. In some embodiments, forming the dielectric core includes depositing SiO.

In some embodiments, the method further includes alternatingly depositing a plurality of first material layers and a plurality of second material layers over the substrate to form a stack structure over the substrate, and repetitively etching the plurality of first material layers and the plurality of second material layers along a direction perpendicular to a top surface of the substrate to respectively form the plurality of first layers and the plurality of second layers.

In some embodiments, alternatingly depositing the plurality of first material layers and the plurality of second material layers includes alternatingly depositing a plurality of insulating material layers and a plurality of sacrificial material layers. The plurality of insulating material layers can include a different material than the plurality of sacrificial material layers.

In some embodiments, depositing the plurality of insulating material layers includes depositing a plurality of SiO layers, and depositing the plurality of sacrificial material layers includes depositing a plurality of SiN layers.

In some embodiments, forming the plurality of gate electrodes includes removing the plurality of second layers to form a plurality of gate-forming tunnels, forming an insulating spacer layer over a sidewall of each one of the plurality of gate-forming tunnels, and forming a conductor layer over the insulating spacer layer to fill up the plurality of gate-forming tunnels to form the plurality of gate electrodes.

In some embodiments, forming the insulating spacer layer includes depositing a layer of high-k dielectric material including one or more of AlO, HfO$_2$, and Ta$_2$O$_5$, and forming the conductor layer includes depositing a layer of one or more of tungsten, cobalt, copper, aluminum, polysilicon, doped silicon, silicides, and a combination thereof.

In some embodiments, alternatingly depositing the plurality of first material layers and the plurality of second material layers includes alternatingly depositing a plurality of first sacrificial material layers and a plurality of second sacrificial material layers. The plurality of first sacrificial material layers can include a different material than the plurality of second sacrificial material layers.

In some embodiments, depositing the plurality of first sacrificial material layers includes depositing a plurality of one or more of polysilicon layers and carbon layers, and depositing the plurality of second sacrificial material layers includes depositing a plurality of SiN layers.

In some embodiments, the method further includes forming a first initial gate-line slit in the staircase structure neighboring the semiconductor channel.

In some embodiments, forming the first initial gate-line slit includes forming another patterned photoresist layer over the staircase structure to expose another opening that corresponds to a location of the first initial gate-line slit, and removing another portion of the staircase structure exposed by the other opening to expose the substrate.

In some embodiments, the method further includes removing the plurality of second layers to form another plurality of gate-forming tunnels, forming another insulating spacer layer over a sidewall of each one of the other plurality of gate-forming tunnels, and forming another conductor layer over the other insulating spacer layer to fill up the other plurality of gate-forming tunnels to form the plurality of gate electrodes.

In some embodiments, removing the plurality of second layers includes performing a wet etching process.

In some embodiments, forming the other insulating spacer layer includes depositing another layer of high-k dielectric material having one or more of AlO, HfO$_2$, and Ta$_2$O$_5$, and forming the other conductor layer includes depositing another layer of one or more of W, Co, Cu, Al, polysilicon, doped silicon, silicides, and a combination thereof.

In some embodiments, the method further includes removing excessive materials of the other insulating spacer layer and the other conductor layer over the plurality of first layers, the plurality of gate electrodes, and the substrate to form a second initial gate-line slit that exposes the substrate.

In some embodiments, the method further includes removing the plurality of first layers and a portion of the blocking layer to expose the memory layer and form another gate-line slit.

In some embodiments, removing the portion of the blocking layer to expose the memory layer includes performing an etching process that selectively etches the blocking layer to the memory layer.

In some embodiments, the method further includes removing the plurality of first layers, a portion of the blocking layer to expose the memory layer, a portion of the memory layer to disconnect the memory layer and expose the tunneling layer, and to form a third gate-line slit.

In some embodiments, removing the portion of the memory layer includes an isotropic etching process.

In some embodiments, the method further includes forming a sealing structure that insulates the plurality of gate electrodes from one another and forming an initial source trench in the sealing structure.

In some embodiments, forming the sealing structure includes forming an initial sealing structure that covers the exposed blocking layer, the exposed memory layer, the exposed tunneling layer, the plurality of gate electrodes, and forms an airgap between adjacent gate electrodes. In some embodiments, forming the sealing structure also includes patterning the initial sealing structure to form a source trench that exposes the substrate to form the sealing structure.

In some embodiments, forming the initial sealing structure includes performing a rapid thermal chemical vapor deposition process and the initial sealing structure includes silicon oxide.

In some embodiments, the method further includes performing an ion implantation process in the source trench to form a doped region in the substrate, and filling the source trench with a conductor material.

In some embodiments, the conductor material includes one or more of tungsten, doped poly-silicon, copper, aluminum, cobalt, doped silicon, and silicides.

In some embodiments, a method for forming a 3D memory device includes the following operations. First, a staircase structure of a plurality first layers and a plurality of second layers can be formed alternatingly arranged over a substrate. A semiconductor channel can be formed in the staircase structure, the semiconductor channel extending from a top surface of the staircase structure to the substrate. The plurality of second layers can then be replaced with a plurality of gate electrodes, and the plurality of first layers can be removed. A sealing structure can be formed to insulate the plurality of gate electrodes from one another. Further, A source structure can be formed in the sealing structure, the source structure extending from the top surface of the staircase structure to the substrate.

In some embodiments, forming the sealing structure includes depositing a dielectric material that covers the plurality of gate electrodes and forms an airgap between adjacent gate electrodes.

In some embodiments, depositing the dielectric material includes performing a rapid thermal chemical vapor deposition process and the sealing structure includes silicon oxide.

In some embodiments, forming the staircase structure includes alternatingly depositing a plurality of first material layers and a plurality of second material layers over the substrate to form a stack structure over the substrate, and repetitively etching the plurality of first material layers and the plurality of second material layers along a direction perpendicular to a top surface of the substrate to respectively form the plurality of first layers and the plurality of second layers.

In some embodiments, forming the semiconductor channel in the staircase structure includes patterning the staircase structure to form a channel hole that extends from the top surface of the staircase structure to the substrate, and filling the channel hole with a blocking layer, a memory layer over the blocking layer, a tunneling layer over the memory layer, a semiconductor layer over the memory layer, and a dielectric core.

In some embodiments, replacing the plurality of second layers with a plurality of gate electrodes includes the following operations. First, the plurality of second layers can be removed to form a plurality of gate-forming tunnels. An insulating spacer layer can be formed over a sidewall of the plurality of gate-forming tunnels. A conductor layer can be deposited over the insulating spacer layer to fill up the plurality of gate-forming tunnels.

In some embodiments, forming the source structure in the sealing structure includes forming a source trench in the sealing structure. The source trench can extend from the top surface of the staircase structure to the substrate. Forming the source structure in the sealing structure can also include performing an ion implantation process to form a doped region in the substrate at a bottom of the source trench, and depositing a conductor layer to fill up the source trench.

In some embodiments, a 3D memory device includes a staircase structure of a plurality of gate electrodes insulated by a sealing structure over a substrate. The sealing structure can include an airgap between adjacent gate electrodes along a direction perpendicular to a top surface of the substrate. The 3D memory device can also include a semiconductor channel extending from a top surface of the staircase structure to the substrate. The semiconductor channel can include a memory layer having at least two portions extending along different directions. The 3D memory device can also include a source structure extending from the top surface of the staircase structure to the substrate and between adjacent gate electrodes along a direction parallel to the top surface the substrate.

In some embodiments, the sealing structure covers the plurality of gate electrodes and includes silicon oxide.

In some embodiments, the memory layer extends at least along the direction perpendicular to the top surface of the substrate and the direction parallel to the top surface of the substrate.

In some embodiments, the memory layer includes disconnected portions, each one of the disconnected portions including a vertical portion and at least one horizontal portion and partially surrounding a respective gate electrode.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
   a structure comprising interleaved a plurality of gate electrodes and a plurality of dielectric layers over a substrate, the gate electrodes being insulated by a sealing structure, wherein
      the sealing structure comprises an insulating material between adjacent gate electrodes along a vertical direction, and
      side surfaces of the gate electrodes and side surfaces of the dielectric layers form an offset along a non-vertical direction different from the vertical direction;
   a semiconductor channel extending in the structure, wherein the semiconductor channel comprises a memory layer, the memory layer comprising a plurality of vertical portions extending in the vertical direction and a plurality of non-vertical portions extending in the non-vertical direction; and
   a source structure extending in the structure.

2. The 3D memory device of claim 1, wherein the sealing structure covers the plurality of gate electrodes and comprises silicon oxide.

3. The 3D memory device of claim 1, wherein the memory layer comprises disconnected portions, each one of the disconnected portions comprising at least one of the vertical portions and at least one of the non-vertical portions and partially surrounding a respective gate electrode.

4. The 3D memory device of claim 1, wherein the insulating material comprises an air gap.

5. The 3D memory device of claim 1, wherein the memory layer is conformal with the plurality of gate electrodes and the plurality of dielectric layers.

6. The 3D memory device of claim 1, wherein the memory layer extends continuously in the vertical direction and the non-vertical direction.

7. The 3D memory device of claim 1, wherein the non-vertical direction is a horizontal direction perpendicular to the vertical direction.

8. A three-dimensional (3D) memory device, comprising:
   a structure comprising interleaved a plurality of gate electrodes and a plurality of dielectric layers over a substrate, the gate electrodes being insulated by a sealing structure, wherein
      the sealing structure comprises an insulating material between adjacent gate electrodes along a vertical direction, and
      side surfaces of the gate electrodes and side surfaces of the dielectric layers form an offset along a non-vertical direction different from the vertical direction;
   a semiconductor channel extending in the structure, wherein the semiconductor channel comprises a memory layer, the memory layer comprising a plurality of vertical portions in contact with a pair of non-vertical portions respectively on each end of the vertical portion, the vertical portions extending in the vertical direction, the non-vertical portions extending in the non-vertical direction; and
   a source structure extending in the structure.

9. The 3D memory device of claim 8, wherein the memory layer is conformal with the plurality of gate electrodes and the plurality of dielectric layers.

10. The 3D memory device of claim 9, wherein the memory layer extends continuously in the vertical direction and the non-vertical direction.

11. The 3D memory device of claim 9, wherein the memory layer comprises disconnected portions, each one of the disconnected portions comprising one of the vertical portions and at least one of the non-vertical portions and partially surrounding a respective gate electrode.

12. The 3D memory device of claim 8, wherein the sealing structure covers the plurality of gate electrodes and comprises silicon oxide.

13. The 3D memory device of claim 8, wherein the insulating material comprises an air gap.

14. The 3D memory device of claim 8, wherein the non-vertical direction is a horizontal direction perpendicular to the vertical direction.

15. A three-dimensional (3D) memory device, comprising:
   a structure comprising interleaved a plurality of gate electrodes and a plurality of dielectric layers over a substrate, the gate electrodes being insulated by a sealing structure, wherein
      the sealing structure comprises an insulating material between adjacent gate electrodes along a vertical direction, and
      side surfaces of the gate electrodes and side surfaces of the dielectric layers form an offset along a non-vertical direction different from the vertical direction;
   a semiconductor channel extending in the structure, wherein the semiconductor channel comprises a memory layer, the memory layer comprising a plurality of first portions extending in a first direction and a plurality of second portions extending in a second direction, the second direction being different from the first direction; and
   a source structure extending in the structure.

16. The 3D memory device of claim 15, wherein the memory layer is conformal with the plurality of gate electrodes and the plurality of dielectric layers.

17. The 3D memory device of claim 16, wherein the memory layer extends continuously in the first direction and the second direction.

18. The 3D memory device of claim 16, wherein the memory layer comprises disconnected portions, each one of the disconnected portions comprising one of the first portions and at least one of the second portions and partially surrounding a respective gate electrode.

19. The 3D memory device of claim 15, wherein the insulating material comprises an air gap.

20. The 3D memory device of claim 15, wherein the first direction is a vertical direction and the second direction is a lateral direction.

\* \* \* \* \*